United States Patent [19]

Yamamoto et al.

[11] Patent Number: 5,216,491
[45] Date of Patent: Jun. 1, 1993

[54] SEMICONDUCTOR PHOTOCONDUCTIVE DEVICE WITH LAMINATED REFRACTORY METAL ELECTRODE

[75] Inventors: Shigeru Yamamoto; Takehito Hikichi, both of Kanagawa, Japan

[73] Assignee: Fuji Xerox Co., Ltd., Tokyo, Japan

[21] Appl. No.: 775,604

[22] Filed: Oct. 15, 1991

[30] Foreign Application Priority Data

Oct. 18, 1990 [JP] Japan ............... 2-277812

[51] Int. Cl.$^5$ ........................................... H01L 27/14
[52] U.S. Cl. ........................ 257/53; 136/256;
257/292; 257/435; 257/459; 257/448; 257/453
[58] Field of Search ........... 357/30 G, 30 H, 30 K, 357/30 P, 71, 30 Q, 30 R, 2, 4, 30 I, 30 PF, 71 S, 32, 65; 136/256

[56] References Cited

U.S. PATENT DOCUMENTS

| 4,082,568 | 4/1978 | Lindmayer | 357/30 Q X |
| 4,366,336 | 12/1982 | Donaghey | 357/30 Q X |
| 5,049,954 | 9/1991 | Shimada et al. | 357/71 X |

FOREIGN PATENT DOCUMENTS 63-9358  1/1988 Japan .

OTHER PUBLICATIONS

Sequeda, "The Role of Thin Film Materials on the Technology of Integrated Circuit Fabrication", *Journal of Metals*, Nov. 1985, pp. 54–59.
Holloway et al., "Tantalum as a Diffusion Barrier Between Copper and Silicon", *Appl. Phys. Lett.*, 57(17), Oct. 22, 1990, pp. 1736–1738.
Ting et al., "The Use of titanium-Based Contact-Barrier Layers in Silicon Technology", *Thin Solid Films*, 96 (1982), pp. 327–345.

*Primary Examiner*—William Mintel
*Attorney, Agent, or Firm*—Finnegan, Henderson, Farabow, Garrett and Dunner

[57] ABSTRACT

A semiconductor device constituting a light detection element in which a photoconductive layer is sandwiched between a transparent electrode and a metal electrode, in which the metal electrode has a lamination structure consisted by two different metals, one of the metals on the photoconductive layer side being formed of tantalum (Ta) or tungsten (W), the other of the metals being formed of titanium (Ti). Thereby, silicide is prevented from being formed in the interface to the photoconductive layer, so that the titanium (Ti) can be made to act as a good etching stopper at the time of patterning the photoconductive layer by etching, and since titanium (Ti) which has high electrolytic-corrosion-proof is used as the metal electrode, it is possible to obtain a semiconductor device having high reliability.

4 Claims, 5 Drawing Sheets

SEMICONDUCTOR PHOTOCONDUCTIVE DEVICE WITH LAMINATED REFRACTORY METAL ELECTRODE

BACKGROUND OF THE INVENTION

The present invention relates to a semiconductor device, and particularly relates to a structure of a light detection element in an image sensor in which a light detection element and a thin film transistor are formed on the same substrate, and in which the thin film transistor is protected to thereby improve the yield.

Conventionally, a contact-type image sensor is used for projecting and converting picture information of an original document into electric signals having one to one correspondence. There has been proposed a TFT-driving image sensor in which a projected picture is divided into a number of picture elements, and charges produced in respective light detection elements corresponding to the picture elements are accumulated temporarily in wiring capacities of respective wirings for every specific block by switching elements constituted by thin film transistors (TFT), and read out as electric signals by a driving IC sequentially in time series at a rate in a range of from several hundred KHz to several MHz. In this TFT image sensor, by a matrix operation performed by TFTs, it is possible to read light detection elements in a plurality of blocks by a single driving IC, so that it is possible to reduce the number of driving ICs for driving an image sensor.

A TFT-driving image sensor is, for example, as shown in an equivalent circuit thereof in FIG. 3, constituted by a light detection element array 101 in which a plurality of light detection elements P(k, n) are arraged in a line having almost the same length as the width of an original document, a charge transfer portion 102 constituted by thin film transistors T(k, n) which one to one correspond to the respective light detection elements P(k, n), and a matrix-shaped multilayer wiring 103.

The light detection element array 101 is divided into k blocks of light detection element groups, and n light detection elements P(k, n) constituting each group of light detection elements can be expressed equivalently by photodiodes and parasitic capacities. The respective light detection elements P(k, n) are connected with drain electrodes of the corresponding thin film transistors T(k, n). The respective source electrodes of the thin film transistors T(k, n) are connected with the corresponding common signal lines 104 (n lines) for every light detection element group through the multilayer wiring 103 connected in a matrix, and the common signal lines 104 are connected with a driving IC 105. The gate electrodes of the respective thin film transistors T(k, n) are connected with a gate pulse generating circuit 106 so that the thin film transistors T(k, n) are made conductive for every block.

Photoelectric charges produced in the respective light detection elements P(k,n) are accumulated in parasitic capacities of the light detection elements P(k, n) and overlap capacities between the drain electrodes and gate electrodes of the thin film transistors T(k, n) for a constant time, and thereafter are transferred to and accumulated in wiring capacities CL of the multilayer wiring 103 sequentially for every block in such a manner that the thin film transistors T(k, n) are used as switches for transferring charges. That is, a gate pulse $\phi$G1 transferred from the gate pulse generating circuit 106 through a gate signal line G1 makes thin film transistors T(1, 1) to T(1, n) in the first block turn on, so that charges produced in the respective light detection elements P(k, n) in the first block are transferred to and accumulated in the respective wiring capacities CL. Then the charges accumulated in the respective wiring capacities CL change the electric potentials of the respective common signal lines 104, and analog switches SWn in the driving IC 105 are turned on sequentially to extract these potential values through an output line 107 in time series. Then gate pulses $\phi$G2 to $\phi$Gk turn on the thin film transistors T(2, 1) to T(2, n) of the second block through the thin film transistors T(k, 1) to T(k, n) of the k-th block respectively, so that charges on the light detection elements are transferred for every block and read sequentially to obtain picture signals of one line of the main scanning direction of an original document. The above-mentioned operation is repeated while the original document is shifted by an original document feeding means (not-shown) such as a roller, so that picture signals of the whole of the original document can be obtained (reference be made to Japanese Unexamined Patent Publication No. Sho-63-9358).

A light detection element P in the above-mentioned image sensor and a thin film transistor T provided for every light detection element P for transferring charges produced in the light detection element P are formed on the same glass substrate 1 as shown in FIGS. 2A to 2D. A production process of the light detection element P and the thin film transistor T will be described with reference to FIGS. 2A to 2D.

First, a chromium layer (Cr) is formed on a glass substrate 1 and patterned to thereby form a gate electrode 2.

Next, a silicon nitride film (SiNx) to be formed into a gate insulation layer 3, an amorphous silicon hydride (a-Si:H) film 4' to be formed into a semiconductor active layer 4, and a silicon nitride (SiNx) film are successively formed, and then the silicon nitride (SiNx) film is patterned to thereby form an upper insulation layer 5 on the gate electrode 2.

Succeedingly, an n+ amorphous silicon hydride (n+a-Si:H) film 6', a metal film 7' to be formed into a lower electrode of the light detection element P and a barrier metal layer of the thin film transistor, an amorphous silicon hydride (a-Si:H) film 8', and an indium-tin oxide (ITO) film 9' are formed continuously (FIG. 2A).

After a resist (not shown) is formed on the indium-tin oxide film 9', the pattern of a transparent electrode 9 of the light detection element P is formed by an etching process (FIG. 2B).

Next, the amorphous silicon hydride film 8' is patterned by an etching process so as to form a photoconductive layer 8 of the light detection element P (FIG. 2C).

Next, the metal film 7' is patterned by a photo-lithograph process so as to form a lower electrode 7a of the light detection element P and barrier metal layers 7b and 7c of the thin film transistor T. Succeedingly, the n+ amorphous silicon hydride film 6, is patterned with the same mask so as to form ohmic contact layers 6b and 6c of the thin film transistor T, and further the amorphous silicon hydride (a-Si:H) film 4, is patterned so as to form the semiconductor active layer 4 of the thin film transistor T (FIG. 2D).

In the above-mentioned production process, the metal film 7' serves also as an etching stopper at the time of etching the amorphous silicon hydride film 8' to form the photoconductive layer 8, as shown in FIG. 2C. Therefore the metal film 7' is formed of a material such as, for example, chromium (Cr) or titanium (Ti), which cannot be etched at the time of etching the amorphous silicon hydride film 8'.

In the case where chromium (Cr) is used as the metal film 7', it becomes a good etching stopper at the time of etching the amorphous silicon hydride film 8', but it is apt to be melted by electrolytic corrosion, so that there has been a problem that the reliability of the light detection element P or the thin film transistor T is deteriorated.

On the other hand, in the case where titanium (Ti) is used as the metal film 7', it is apt to produce a reaction in the interface between the amorphous silicon hydride film 8, and the metal film 7' of titanium (Ti) to thereby form silicide, and this silicide is etched under the etching conditions of the amorphous silicon hydride film 8', so that there has been a problem that the yield of the thin film transistor T formed under the metal film 7' is deteriorated.

SUMMARY OF THE INVENTION

The present invention has been attained in the above circumstances, and an object thereof is to provide a structure of a semiconductor device in which the yield is improved and the reliability is ensured, in the case of forming light detection elements and thin film transistors on one and the same substrate.

In order to solve the foregoing problems of the prior art, according to the present invention, the a semiconductor device constituting a light detection element in which a photoconductive layer is sandwiched between a transparent electrode and a metal electrode, is characterized in that the metal electrode has a lamination structure comprising two different metals, one of the metals on the photoconductive layer side being formed of tantalum (Ta) or tungsten (W), the other of the metals being formed of titanium (Ti).

According to the present invention, since the metal electrode has the two-layer structure of tantalum (Ta) or tungsten (W) and titanium (Ti), if the tantalum (Ta) or tungsten (W) is formed on the photoconductive layer side, silicide is prevented from being formed in the interface to the photoconductive layer, so that the titanium (Ti) can be made to act as a good etching stopper at the time of patterning the photoconductive layer by etching. In addition, since titanium (Ti) which is highly electrolytic-corrosion-proof is used as the metal electrode, it is possible to obtain a semiconductor device having high reliability.

DESCRIPTION OF PREFERRED EMBODIMENT

Figure 1A:
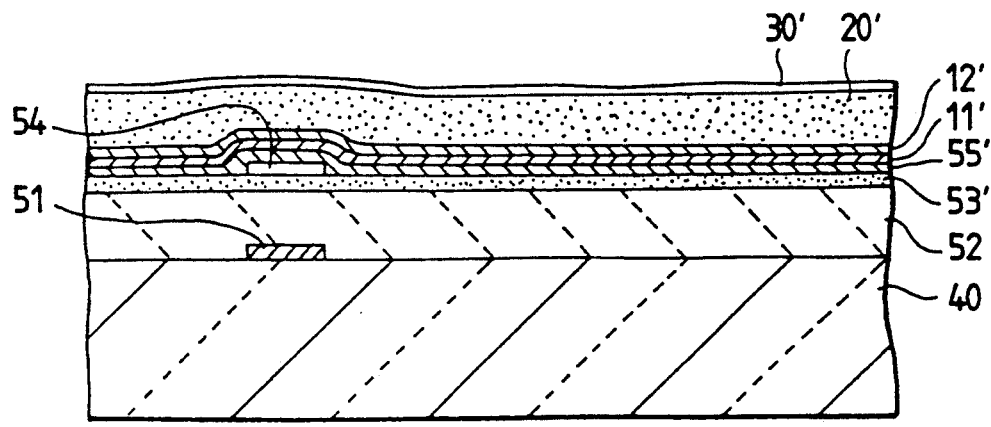
FIGS. 1A to 1E are sectional explanatory diagrams illustrating a production process of an image sensor according to an embodiment of the present invention.

An embodiment of the present invention will be described with reference to FIG. 1E.

A light detection element P has a sandwich structure of sequentially laminating, on a glass substrate 40, a metal electrode 10 formed by laminating two different metals, a photoconductive layer 20 formed of amorphous silicon hydride (a-Si:H), and a transparent electrode 30 formed of indium-tin oxide (ITO).

The metal electrode 10 is constituted by a titanium (Ti) layer 11 formed belt-like in the main scanning direction (in the direction of front-back of the drawing) and having an leading portion 11a in the sub-scanning direction, and a tantalum (Ta) layer 12 divided and formed separately for every light detection element P (for every bit), and the metal electrode 10 is arranged so that the tantalum (Ta) layer 12 contacts with the photoconductive layer 20.

The photoconductive layer 20 and the transparent electrode 30 are divided and formed separately for every light detection element P (for every bit), so that the portion in which the photoconductive layer 20 is sandwiched between the metal electrode 10 and the transparent electrode 30 constitutes every light detection element P, and the mass of those light detection elements P forms a light detection element array. The reason why the photoconductive layer 20 and the transparent electrode 30 are divided in such a manner is that, if the photoconductive layer 20 of a-Si:H is made to be a common layer, the photoelectric conversion effect produced in a certain light detection element P may give interference to an adjacent light detection element P, and reduction of this interference is therefore intended.

The photoconductive layer 20 side of the metal electrode 10 is constituted by the tantalum (Ta) layer 12 to prevent silicide from being produced in the interface of amorphous silicon hydride (a-Si:H) forming the photoconductive layer 20 and tantalum (Ta). Therefore, tantalum (Ta) as a layer of the photoconductive layer 20 side of the metal electrode 10 may be replaced by a material forming no silicide with amorphous silicon hydride (a-Si:H), for example, tungsten (W).

In addition, in the photoconductive layer 20, amorphous silicon hydride may be replaced by CdSe (cadmium selenide), amorphous silicon carbide (a-SiC), amorphous silicon germanide (a-SiGe), or the like.

A thin film transistor T functioning as a charge transfer portion is constituted by sequentially laminating, on the glass substrate 40, a gate electrode 51 formed of chromium (Cr), a gate insulation layer 52 formed of a silicon nitride film, a semiconductor active layer 53 formed of amorphous silicon hydride (a-Si:H), an upper insulation layer 54 provided in opposition to the gate electrode 51 and formed of a silicon nitride film, ohmic contact layers 55b and 55c each formed of n+ amorphous silicon hydride (n+ a-Si:H), and barrier metal layers 11b and 11c each formed of titanium (Ti). The ohmic contact layer 55b and the barrier metal layer 11b which constitute a drain electrode are arranged in opposite to the ohmic contact layer 55c and the barrier metal layer 11c which constitute a source electrode S, the upper insulation layer 54 being centered between the source and drain electrodes.

The above-mentioned light detection element P and thin film transistor T are insulated by a polyimide film 60, while the transparent electrode 30 of the light detection element P is connected with the drain electrode D of the thin film transistor T through an leading wiring 71 formed of aluminum (Al) on the polyimide film 60. The source electrode S of the thin film transistor T is connected with a signal wiring 72. The above-mentioned barrier metal layers 11b and 11c are interposed to prevent the leading wiring 71 of an aluminum wiring or the signal wiring 72 and n+ amorphous silicon from being diffusing between the leading wiring 71 or the signal wiring 72 and the n+ amorphous silicon.

A constant bias voltage VB is applied to the leading portion 11a of the titanium (Ti) layer 11 of the metal electrode 10 through a power supply wiring 73.

Next, a producing method of the above-mentioned image sensor will be described with reference to FIGS. 1A to 1E.

On the glass substrate 40 which has been tested and cleaned, a first chromium (Cr1) layer which will become the gate electrode 51 of the thin film transistor T is formed by DC sputtering to a film thickness of about 750 Å at a temperature of about 150° C.

Next, the chromium (Cr) layer is patterned by a photolithograph process and an etching process using a mixture solution of a cerium ammonium nitrate, a perchloric acid, and water, so that the gate electrode 51 is formed, and thereafter a resist is separated out.

Next, after alkaline cleaning, over the whole of the glass substrate 40, a silicon nitride film (SiNx) which will become the gate insulation layer 52 of the thin film transistor T to a film thickness of about 3,000 Å, an amorphous silicon hydride (a-Si:H) film 53, to a thickness of about 500 Å, and a silicon nitride (SiNx) film which will become the upper insulation layer 54 to a film thickness of about 1,500 Å are formed sequentially and continuously by plasma CVD (P-CVD) without breaking vacuum. By the continuous film-formation without breaking vacuum, it is possible to protect the respective interfaces of the films from contamination, so that it is possible to stabilize the characteristics of the thin film transistor.

The above-mentioned silicon nitride film (gate insulation layer 52) is formed by the P-CVD method under the conditions of the substrate temperature in a range of from 300° to 400° C., the gas pressure in a range of from $SiH_4$ and $NH_3$ of 0.1 to 0.5 Torr, the gas flow rate of $SiH_4$ gas in a range of 10 to 50 SCCM, the flow rate of $NH_3$ gas in a range of from 100 to 300 SCCM, and the RF power in a range of from 50 to 200 W.

The above-mentioned amorphous silicon hydride film 53' is formed by the P-CVD method under the conditions of the substrate temperature in a range of from about 200° to 300° C., the gas pressure of $SiH_4$ in a range of from 0.1 to 0.5 Torr, the flow rate of $SiH_4$ gas in a range of from 100 to 300 SCCM, and the RF power in a range of from 50 to 200 W.

The above-mentioned silicon nitride film (upper insulation layer 54) is formed by the P-CVD method under the conditions of the substrate temperature in a range of from about 200° to 300° C., the gas pressure of $SiH_4$ and $NH_3$ in a range of from 0.1 to 0.5 Torr, the flow rate of $SiH_4$ gas in a range of from 10 to 50 SCCM, the flow rate of $NH_3$ gas in a range of from 100 to 300 SCCM, and the RF power in a range of from 50 to 200 W.

Next, the silicon nitride film is coated with a resist to form a pattern of the silicon nitride film into a shape corresponding to the gate electrode 51, and back surface exposure, development, and etching with a mixture solution of HF and $NH_4F$ are performed by use of the pattern of the gate electrode 51 as a mask from the back surface of the glass substrate 40, so that the upper insulation layer 54 is formed, and thereafter the resist is separated out.

After BHF treatment, an n+ amorphous silicon film 55' is formed thereon to a film thickness of about 1,000 Å under at a temperature of about 250° C. by the P-CVD using a mixture gas of SiH and $PH_3$.

Next, a titanium (Ti) film 11' is formed to a film thickness in a range of from about 500 to 3,000 Å by DC sputtering. Then, a tantalum (Ta) film 12' is continuously formed to a film thickness in a range of from about 50 to 1,000 Å by DC sputtering. In the interface between the titanium (Ti) film 11' and the tantalum (Ta) film 12', an alloy layer is formed by continuous coating by sputtering, thereby improving the dry-etching-proof of amorphous silicon hydride at the time of dry etching which will be described later.

Next, an amorphous silicon hydride film 20' is formed to a film thickness of about 13,000 Å, and an indium-tin oxide (ITO) film 30' is formed to a film thickness of about 600 Å. At this time, alkaline cleaning is performed before the respective film coating (FIG. 1A).

The above-mentioned amorphous silicon hydride film 20' is formed by the P-CVD method under the conditions of the substrate temperature in a range of from 170° to 250° C., the gas pressure of $SiH_4$ in a range of from 0.3 to 0.7 Torr, the flow rate of $SiH_4$ gas in a range of from 150 to 300 SCCM, and the RF power in a range of from 100 to 200 W.

The indium-tin oxide (ITO) film 30' is formed by DC magnetron sputtering under the conditions of the substrate temperature of a room temperature, the gas pressure of Ar and $O_2$ of $1.5 \times 10^{-3}$ Torr, the flow rate of Ar gas in a range of from 100 to 150 SCCM, the flow rate of $O_2$ gas in a range of from 1 to 2 SCCM, and the DC power in a range of from 200 to 400 W.

Figure 1B:
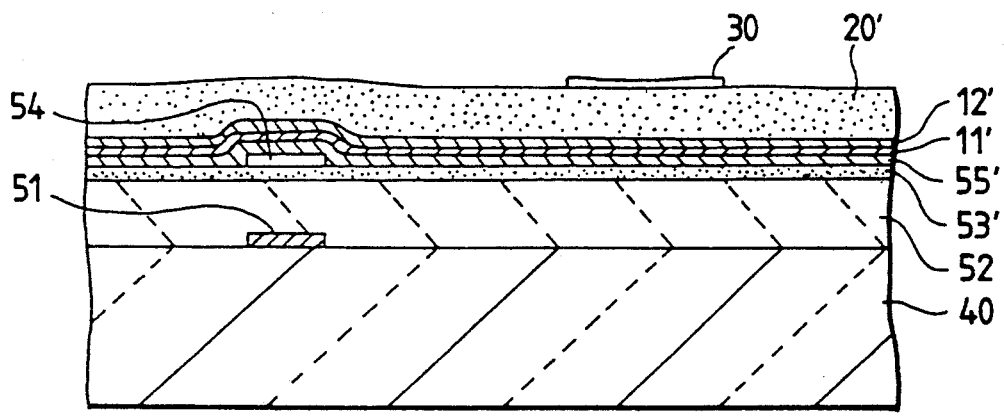
Figure 1C:
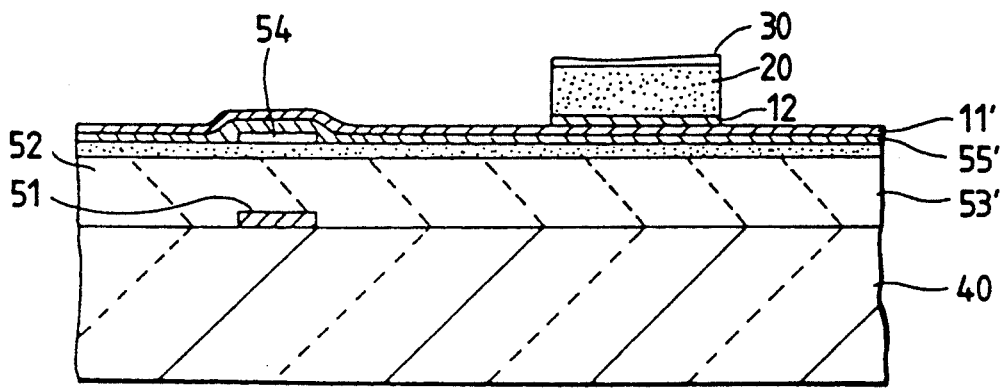

Thereafter, the indium-tin oxide (ITO) film 30' is patterned by a photo-resolution process and an etching process using a dilute hydrochloric acid, thereby forming divided transparent electrodes 30 separated for every light detection element P (FIG. 1B).

Then, the amorphous silicon hydride film 20' is patterned by dry etching using a mixture gas of $C_2ClF_5$, $SF_6$ and $O_2$, thereby forming divided photoconductive layers 20 separated for every light detection element P. This etching process is performed under the conditions of $C_2ClF_5$ of 100 SCCM, $SF_6$ of 100 SCCM, $O_2$ of 20 SCCM, the RF power of 400 W, and the pressure of 0.3 Torr. Under those etching conditions, the tantalum (Ta) film 12' is also etched, thereby forming the tantalum (Ta) layer 12 having the same pattern as the photoconductive layer 20. In addition, the titanium (Ti) film 11' acts as an etching stopper to thereby protect the respective layers formed under the titanium (Ti) film 11'. At this time, since the etching rate of tantalum (Ta) is lower than that of the amorphous silicon hydride, side-etching of the tantalum (Ta) layer 12 is not caused. At the time of this dry etching, side-etching is caused large on amorphous silicon hydride which will be become the photoconductive layer 20, so that the etching of the transparent electrode 30 (ITO) is performed again before separating a resist. By the above process, formed is the transparent electrode 30 etched from the circumferential back of the transparent electrode 30 and having the same size as the photoconductive layer 20.

Next, the titanium (Ti) film 11' is exposed and developed by the photo-lithograph method to thereby form a resist pattern, and patterned in an etching process using a fluoric nitric acid to thereby form the titanium (Ti) layer 11 of the metal electrode 10 of the light detection element P and the barrier metal layers 11b and 11c of the thin film transistor T, and thereafter the resist is separated out. The titanium (Ti) layer 11 of the light detection element P and the barrier metal layer 11b are formed so as to be separated perfectly.

Figure 1D:
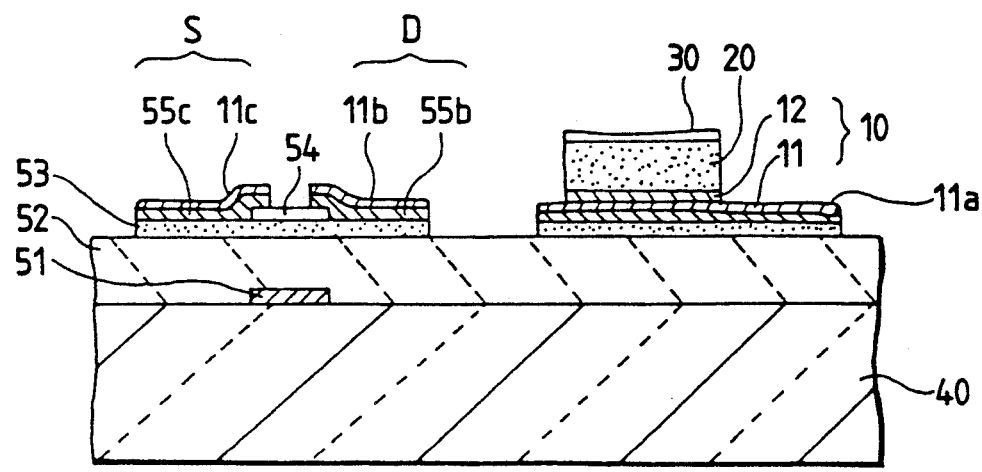
Figure 1E:
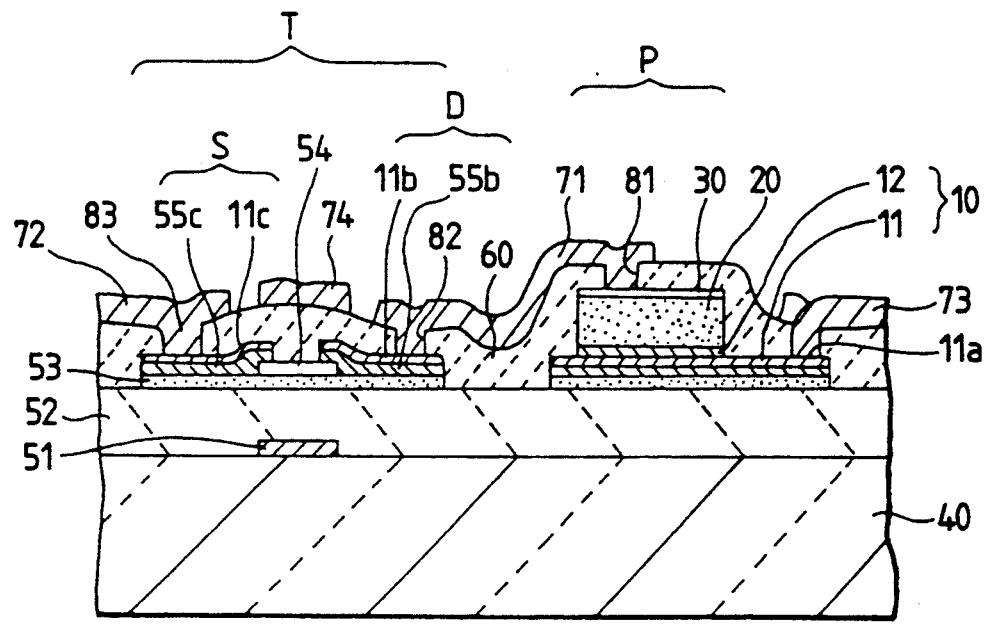
Figure 2A:
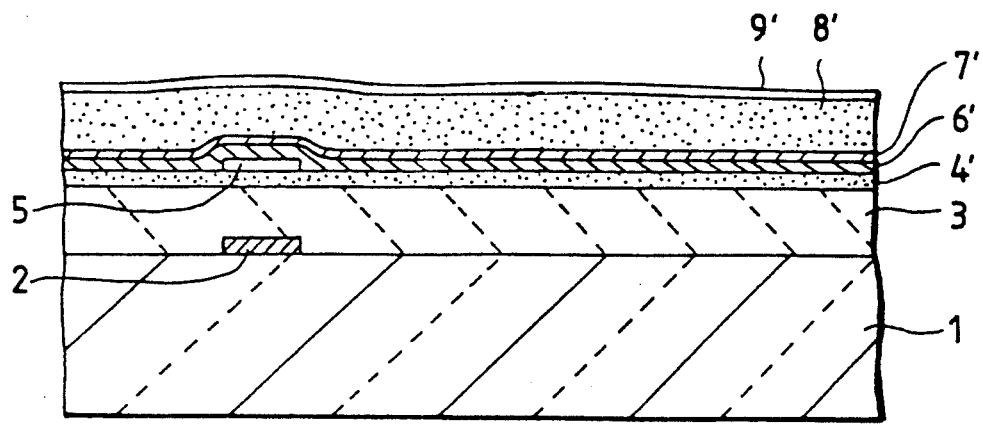
FIG. 2A to 2D are sectional explanatory diagrams illustrating a production process of a conventional image sensor.
Figure 2B:
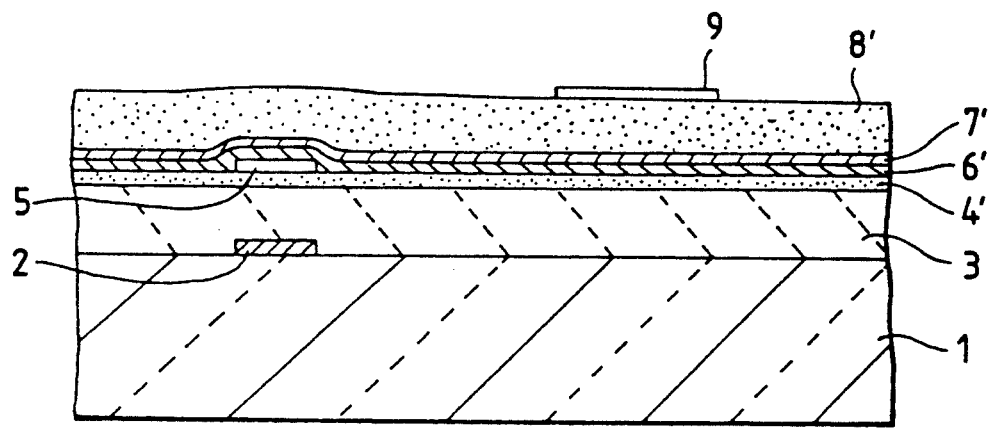
Figure 2C:
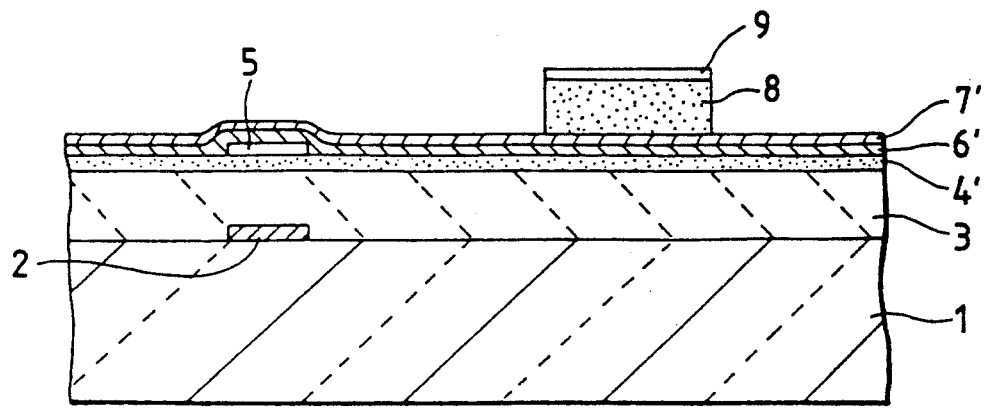
Figure 2D:
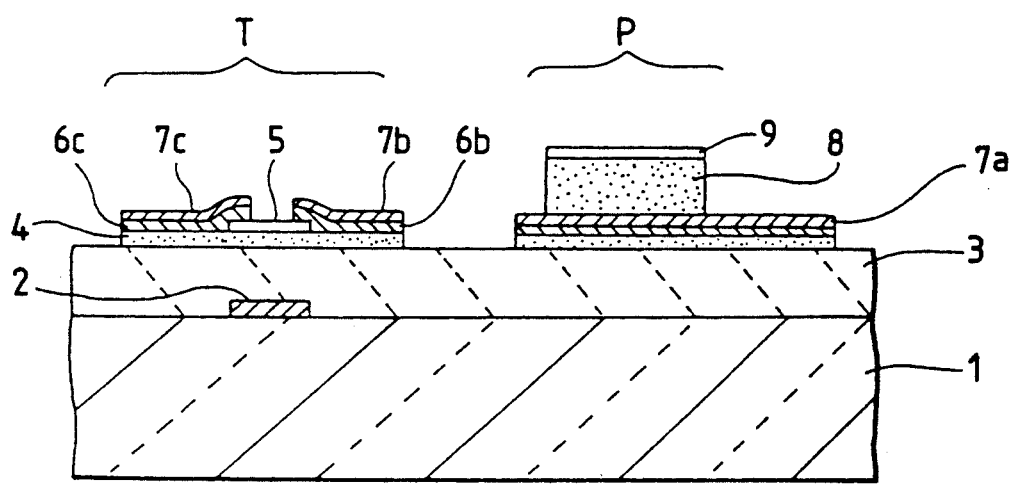
Figure 3:
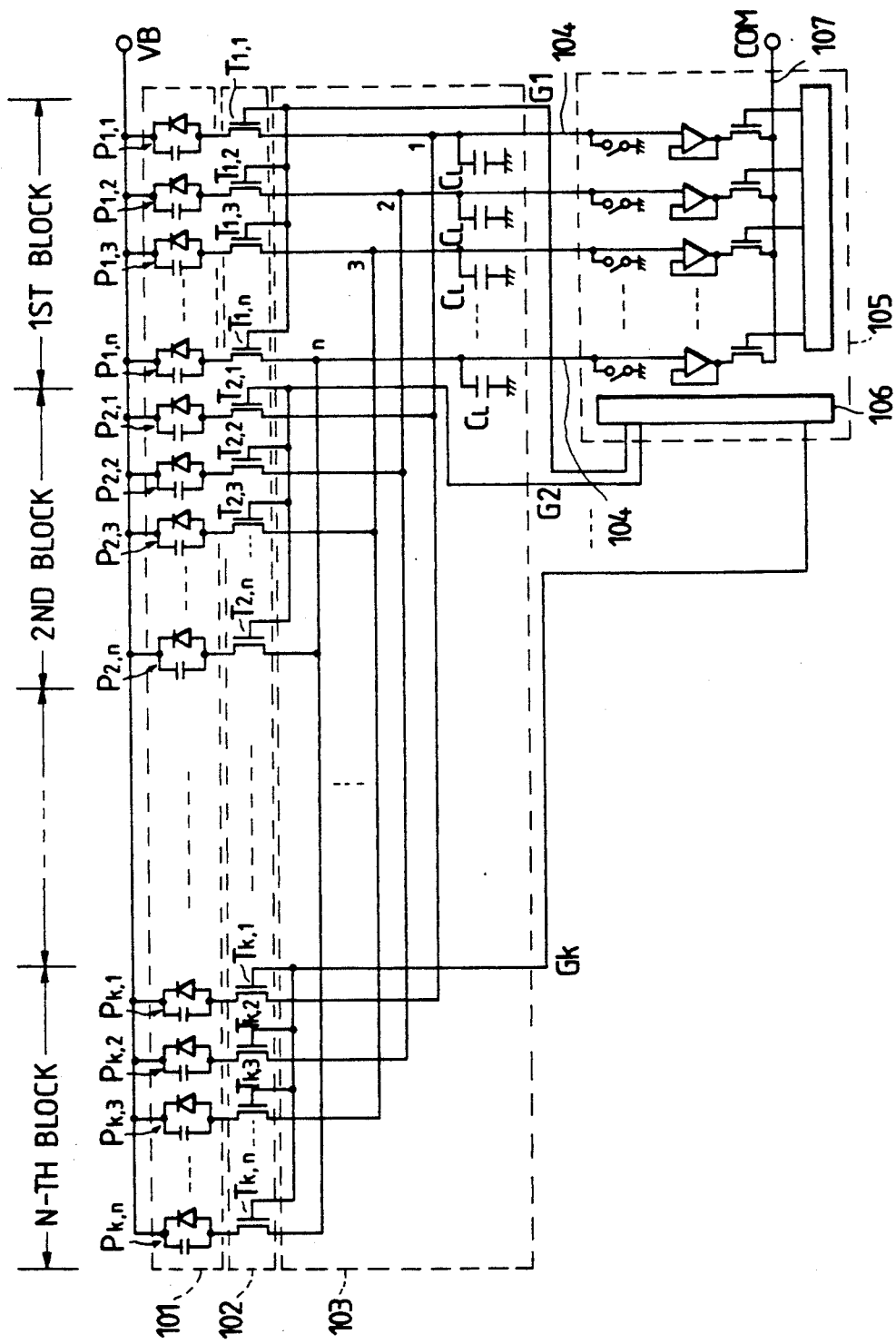
FIG. 3 is an equivalent circuit diagram of a matrix-driving-type image sensor.

Next, when dry etching is performed with a mixture gas of $C_2ClF_5$ and $SF_6$, the portion having no titanium (titanium (Ti) layer 11, and barrier metal layers 11b and 11c) and no SiNx (upper insulation layer 54) is etched, so that patterns of an a-Si:H layer and n+ amorphous silicon hydride (n+ a-Si:H) are formed. Through this process, an n+ a-Si:H layer and an a-Si:H layer are formed under the titanium layer 11 of the light detection element P. In addition, by this process, patterns of the ohmic contact layers 55b and 55c are formed, so that the drain electrode D and the source electrode S are formed, and further a pattern of the semiconductor active layer 53 is formed (FIG. 1D).

The polyimide film 60 is applied to a film thickness of 13,000 Å so as to cover the whole of the light detection element P and the thin film transistor T, patterned in a photo-resolution etching process after pre-baking at about 160° C., and then baked again. By this patterning, formed are contact holes 81 and 82 for connecting the transparent electrode 30 of the light detection element P with the drain electrode D of the thin film transistor T, and a contact hole 83 for connecting the source electrode S with the signal wiring 72. Further, in order to perfectly remove polyimide and so on left in the contact portions, Descum is performed for exposure to plasma with $O_2$.

Next, an aluminum (Al) film is formed by DC magnetron sputtering to a thickness of about 10,000 Å at a temperature of about 150° C. so as to cover the whole of the image sensor, and patterned in a photo-lithograph etching process using a mixture solution of a fluoric acid, a nitric acid, a phosphoric acid and water to obtain a desired pattern, and thereafter a resist is removed. By this, respectively formed are the leading wiring 71 connecting the transparent electrode 30 with the thin film transistor T, the signal wiring 72, the power supply wiring 73, and a photo-shield layer 74 of the thin film transistor (FIG. 1E).

Lastly, polyimide is applied to a thickness of about 3 μm, pattered in a photo-resolution etching process after pre-baking at a temperature of about 125° C., and baked again at a temperature of about 230° C. for 90 minutes to thereby form a passivation layer (not-shown). Thereafter performed is Descum to thereby remove unnecessarily left polyimide.

In this embodiment, although a photodiode having a Schottky structure is employed as the light detection element P, a PIN structure may be employed. In addition, as the photoconductive layer 20 of the light detection element P, amorphous material (for example, a-SiC, a-SiGe) other than a-Si:H may be used.

According to the above-mentioned embodiment, since a metal electrode has a lamination structure formed of tantalum (Ta) and titanium (Ti), there is no interface between an amorphous silicon hydride (a-Si:H) and a titanium (Ti) layer, so that it is possible to prevent silicide from being produced. In addition, the upper surface of titanium (Ti) is alloyed, so that its etching-proof can be improved.

According to the present invention, a layer of tantalum (Ta) or tungsten (W) is formed on the photoconductive layer side of a metal electrode, so that silicide can be prevented from being produced in the interface to the photoconductive layer, so that the titanium (Ti) can be made to act as a good etching stopper at the time of patterning the photoconductive layer by etching, and protect thin film layers formed under the titanium (Ti), so that it is possible to improve the yield of semiconductor devices.

In addition, since titanium (Ti), which has high electrolytic-corrosion-proof is used as a metal electrode of a light detection element, it is possible to obtain a semiconductor device having high reliability.

What is claimed is:

1. A semiconductor device comprising:
   a light detection element having a photoconductive layer sandwiched between a transparent electrode and a metal electrode;
   said metal electrode having a laminated structure including two different metals, one of said two different metals adjacent said photoconductive layer being formed of either tantalum (Ta) or tungsten (W), the other of said two different metals being formed of titanium (Ti).

2. A semiconductor device as claimed in claim 1, wherein said photoconductive layer is formed of a material selected from the group consisting of amorphous silicon hydride (a-Si:H), cadmium selenide (CdSe), amorphous silicon carbide (a-SiC), and amorphous silicon germanide (a-SiGe).

3. A semiconductor device comprising:
   a plurality of linearly disposed light detection elements, each light detection element having a photoconductive layer sandwiched between a transparent electrode and a metal electrode;
   said metal electrode having a laminated structure including two different metals, one of said two different metals adjacent said photoconductive layer being formed of either tantalum (Ta) or tungsten (W), the other of said two different metals being formed of titanium (Ti);
   wherein the titanium (Ti) portion of the metal electrodes of said light detection elements is provided as a continuous belt extending along said line of light detection elements and common to all of said line of light detection elements, said belt having a leading portion extending beyond said photoconductive layer in a direction substantially perpendicular to the direction of said line of light detection elements.

4. The semiconductor device as claimed in claim 3, wherein the tantalum (Ta) or tungsten (W) portion of the metal electrodes of said light detection elements is divided and formed separately for each of said plurality of light detection elements.

* * * * *